United States Patent
Kang

(10) Patent No.: US 7,732,280 B2
(45) Date of Patent: Jun. 8, 2010

(54) SEMICONDUCTOR DEVICE HAVING OFFSET SPACER AND METHOD OF FORMING THE SAME

(75) Inventor: Sung-Gun Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 138 days.

(21) Appl. No.: 11/905,249

(22) Filed: Sep. 28, 2007

(65) Prior Publication Data

US 2008/0203474 A1 Aug. 28, 2008

(30) Foreign Application Priority Data

Feb. 26, 2007 (KR) .................. 10-2007-0019089

(51) Int. Cl.
*H01L 21/336* (2006.01)
(52) U.S. Cl. ..................... 438/263; 438/265
(58) Field of Classification Search ............. 438/263, 438/265

See application file for complete search history.

(56) References Cited

U.S. PATENT DOCUMENTS 6,737,308 B2 * 5/2004 Kim .................. 438/197

6,780,776 B1 8/2004 Qi et al.

FOREIGN PATENT DOCUMENTS

| JP | 2003-037115 | 2/2003 |
|---|---|---|
| KR | 1020000061322 A | 10/2000 |
| KR | 1020010004037 A | 1/2001 |
| KR | 10-2002-0096379 | 12/2002 |
| KR | 10-2004-0068964 | 8/2004 |
| KR | 10-2006-0000322 | 1/2006 |

OTHER PUBLICATIONS

Korean Office Action dated Feb. 26, 2008.
Decision of Grant dated Sep. 19, 2008.

* cited by examiner

*Primary Examiner*—Douglas M Menz
(74) *Attorney, Agent, or Firm*—Harness, Dickey & Pierce, P.L.C.

(57) ABSTRACT

A method of forming a semiconductor device having an offset spacer may include forming a gate electrode on a semiconductor substrate. An etch stop layer including a nitride may be formed on the entire surface of the semiconductor substrate having the gate electrode. First spacers may be formed on the sidewalls of the gate electrode. The first spacers may be formed of a material layer having an etch selectivity with respect to the etch stop layer. The etch stop layer may be exposed on the semiconductor substrate on both sides of the gate electrode. Lightly-doped drain (LDD) regions may be formed in the semiconductor substrate using the gate electrode and the first spacers as an ion implantation mask. Second spacers may be formed on the first spacers. Accordingly, a semiconductor device having an offset spacer may be provided.

10 Claims, 4 Drawing Sheets

FIG. 1
(CONVENTIONAL)
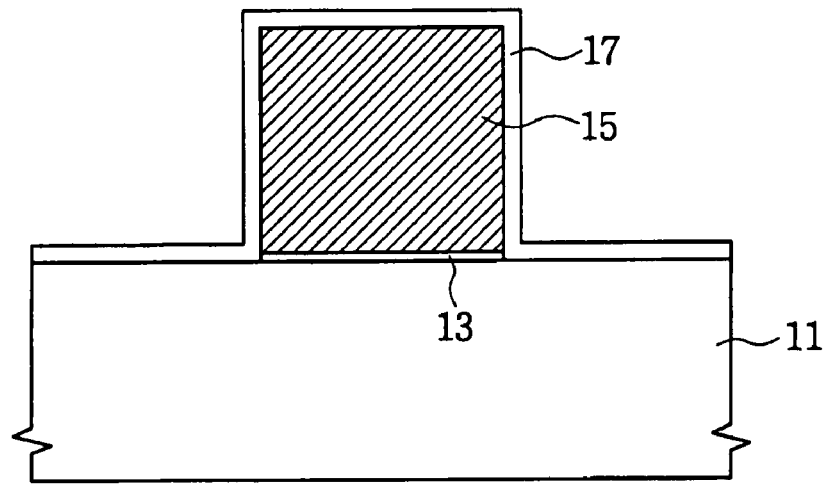
FIG. 2
(CONVENTIONAL)
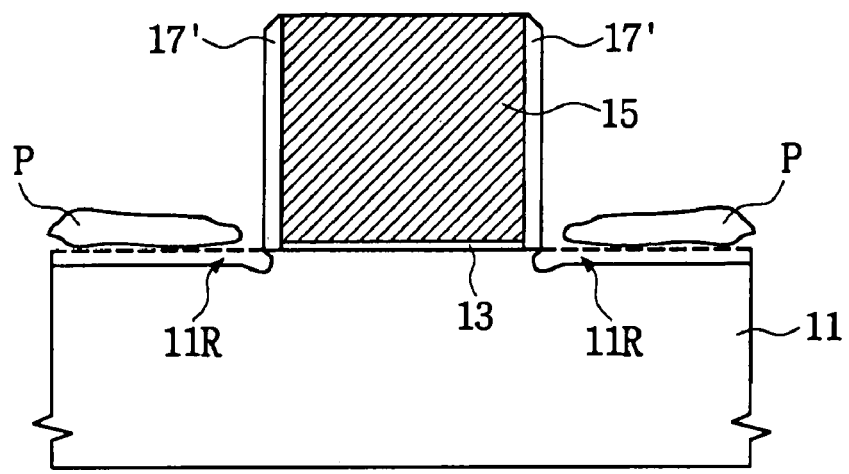

SEMICONDUCTOR DEVICE HAVING OFFSET SPACER AND METHOD OF FORMING THE SAME

PRIORITY STATEMENT

This application claims priority under 35 U.S.C. §119 to Korean Patent Application No. 10-2007-0019089, filed on Feb. 26, 2007 in the Korean Intellectual Property Office (KIPO), the entire contents of which are incorporated herein by reference.

BACKGROUND

1. Technical Field

Example embodiments relate to a semiconductor device and a method of forming the same. Example embodiments also relate to a method of forming a semiconductor device having an offset spacer and a related device.

2. Description of the Related Art

As higher integration is expected of semiconductor devices, research has been conducted to reduce transistor size. A transistor may include a gate electrode disposed on a semiconductor substrate and a pair of source and drain regions spaced apart from each other. The source and drain regions may be respectively disposed within the semiconductor substrate and may be adjacent to both sides of the gate electrode. However, reducing the gate electrode so as to reduce transistor size may result in a short channel effect. Consequently, a technique of forming an offset spacer on sidewalls of the gate electrode has been proposed to reduce or prevent the short channel effect. In such a case, the source and drain regions may be arranged outside the coverage of the offset spacer. As a result, the effective channel length of the transistor having the offset spacer may be lengthened.

FIGS. 1 and 2 are cross-sectional views illustrating a method of forming a conventional semiconductor device having an offset spacer. Referring to FIG. 1, a gate dielectric layer 13 and a gate electrode 15 may be sequentially stacked on a semiconductor substrate 11. A spacer layer 17 may be formed on the semiconductor substrate 11 having the gate electrode 15. The spacer layer 17 may cover the sidewalls of the gate electrode 15 and the surface of the semiconductor substrate 11. The spacer layer 17 may be formed of silicon oxide.

Referring to FIG. 2, an offset spacer 17' may be formed by anisotropically etching the spacer layer 17. The offset spacer 17' may cover the sidewalls of the gate electrode 15. A by-product P (e.g., a polymer) may be produced during the process of anisotropically etching the spacer layer 17 and may adhere to the semiconductor substrate 11. The by-product P may hinder the performance of subsequent processes (e.g., formation of lightly-doped drain (LDD) regions).

For example, forming the LDD regions may include implanting impurity ions into the semiconductor substrate 11 using the gate electrode 15 and the offset spacer 17' as an ion implantation mask. However, the by-product P may have a non-uniform thickness and may cover the semiconductor substrate 11. Thus, the by-product P may hinder the implantation of impurity ions into the semiconductor substrate 11. Accordingly, the LDD regions may exhibit a non-uniform impurity concentration. LDD regions having a non-uniform impurity concentration may have different threshold voltages from each other. As a result, it may be difficult to control the threshold voltages of transistors disposed on the semiconductor substrate 11.

A technique of removing the by-product P by performing a cleaning process on the semiconductor substrate 11 may be employed. However, a surface of the semiconductor substrate 11 may be etched during the cleaning process so as to from a recess region 11R. The recess region 11R may change the effective channel length and may also have an effect on the junction depth.

Another method of forming a semiconductor device having an offset spacer may include forming a gate electrode on a semiconductor substrate. A polysilicon re-oxidation layer covering the electrode and the semiconductor substrate may be formed. An offset spacer may be formed on sidewalls of the gate electrode. The offset spacer may be formed of a nitride layer. The polysilicon re-oxidation layer may reduce or prevent the etching of the semiconductor substrate during the formation of the offset spacer.

However, the gate electrode may be formed of polysilicon, and the semiconductor substrate may be a single crystalline silicon wafer. Additionally, the polysilicon re-oxidation layer may be formed by a thermal oxidation method. Consequently, the polysilicon re-oxidation layer formed on the single crystalline silicon wafer may be thinner than the polysilicon re-oxidation layer formed on the sidewalls of the gate electrode. Accordingly, it may be very difficult to control the thickness of the polysilicon re-oxidation layer.

SUMMARY

Example embodiments provide a method of forming a semiconductor device having an offset spacer, wherein the method reduces or prevents the recession of the semiconductor substrate. Example embodiments also provide a semiconductor device having an offset spacer.

A method of forming a semiconductor device having an offset spacer according to example embodiments may include forming a gate electrode on a semiconductor substrate. An etch stop layer may be formed on the semiconductor substrate and the gate electrode, wherein the etch stop layer may include a nitride. The etch stop layer may be formed on both sides of the gate electrode. A first spacer may be formed on the sidewall of the gate electrode such that the etch stop layer is between the sidewall of the gate electrode and the first spacer. A lightly-doped drain (LDD) region may be formed in the semiconductor substrate using the gate electrode and the first spacer as an ion implantation mask. A second spacer may be formed on the first spacer.

The etch stop layer may be formed of a material having an etch selectivity with respect to the first spacer. The etch stop layer may be formed of silicon nitride or silicon oxynitride. The etch stop layer may also be formed to a thickness of about 0.1 nm to about 100 nm. The gate electrode may be formed of polysilicon. A re-oxidation layer may be formed on an upper surface and the sidewalls of the gate electrode using a thermal oxidation method before forming the etch stop layer.

The formation of the first spacer may include forming a first spacer layer on the etch stop layer and anisotropically etching the first spacer layer until the etch stop layer on the semiconductor substrate is exposed. The first spacer may be formed of silicon oxide. A halo region may be formed in the semiconductor substrate below the first spacer before forming the LDD region. A higher-concentration impurity region may be formed in the semiconductor substrate using the gate electrode, the first spacer, and the second spacer as an ion implantation mask.

A semiconductor device having an offset spacer according to example embodiments may include a semiconductor substrate and a gate electrode on the semiconductor substrate. A first spacer may be disposed on a sidewall of the gate electrode. A second spacer may be disposed on the first spacer. An etch stop pattern may be interposed between the sidewall of the gate electrode and the first spacer. The etch stop pattern may also be provided between the semiconductor substrate and the first and second spacers. A LDD region may be disposed in the semiconductor substrate below the second spacer. The LDD region may also be arranged outside the coverage of the first spacer so as to be adjacent to the first spacer.

The etch stop pattern may be formed of a material having an etch selectivity with respect to the first spacer. The etch stop pattern may be formed of silicon nitride or silicon oxynitride. The etch stop pattern may be formed to a thickness of about 0.1 nm to about 100 nm. The gate electrode may be formed of polysilicon. A re-oxidation layer covering an upper surface and the sidewalls of the gate electrode may be provided. The re-oxidation layer may be a thermal oxide layer. The first spacer may be formed of silicon oxide. A halo region may be disposed in the semiconductor substrate below the etch stop pattern and the first spacer.

BRIEF DESCRIPTION OF THE DRAWINGS

The objects, features, and advantages of example embodiments may be more apparent with reference to the following description in conjunction with the accompanying drawings. The drawings may not have been drawn to scale and are intended to be merely illustrative of example embodiments.

FIGS. 1 and 2 are cross-sectional views illustrating a method of forming a conventional semiconductor device having an offset spacer.

DETAILED DESCRIPTION OF EXAMPLE EMBODIMENTS

Figure 3:
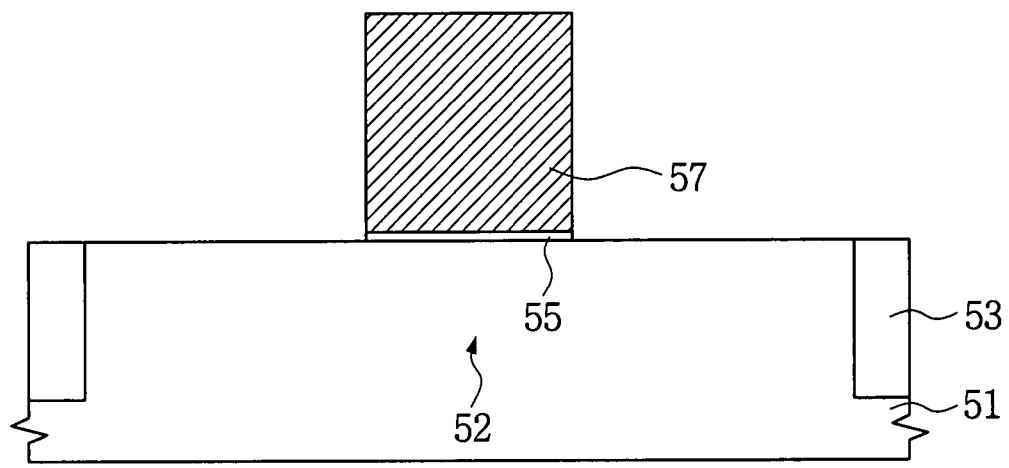
FIGS. 3 to 7 are cross-sectional views illustrating a method of forming a semiconductor device having an offset spacer according to example embodiments.

Example embodiments will now be described more fully hereinafter with reference to the accompanying drawings. Example embodiments may, however, be embodied in different forms and should not be construed as limited to the embodiments set forth herein. Rather, example embodiments have been provided so that this disclosure will be thorough and complete and will fully convey the scope of the present teachings to those skilled in the art. In the drawings, the size of the layers and regions may have been exaggerated for clarity.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIGS. 3 to 7 are cross-sectional views illustrating a method of forming a semiconductor device having an offset spacer according to example embodiments. Referring to FIG. 3, an isolation layer 53 defining an active region 52 may be formed in a semiconductor substrate 51. The semiconductor substrate 51 may be formed of a silicon wafer having first conductivity type impurity ions. The first conductivity type may be an n- or p-type. For example, the semiconductor substrate 51 may be formed of a silicon wafer having p-type impurity ions. The isolation layer 53 may be formed by a shallow trench isolation (STI) technique. The isolation layer 53 may be formed of an insulating layer, e.g., a silicon oxide layer, a silicon nitride layer, a silicon oxynitride layer, or a combination thereof. For example, the isolation layer 53 may be a higher-density plasma oxide layer.

A gate dielectric layer 55 and a gate electrode 57, which may extend over the active region 52 and may be sequentially stacked, may be formed on the semiconductor substrate 51. The gate dielectric layer 55 and the gate electrode 57 may be formed by a deposition process and a patterning process. As a result, the gate dielectric layer 55 and the gate electrode 57 may partially cover an upper surface of the active region 52. The active region 52 may be partially exposed on both sides of the gate electrode 57.

The gate dielectric layer 55 may be an insulating layer, e.g., a silicon oxide layer, a silicon nitride layer, a silicon oxynitride layer, a higher-K dielectric layer, or a combination thereof. The gate dielectric layer 55 may be formed by a thermal oxidation method, a chemical vapor deposition (CVD) method, an atomic layer deposition (ALD) method, or a cyclic deposition method. The gate electrode 57 may be formed of a conductive layer, e.g., a polysilicon layer, a metal layer, a metal silicide layer, or a combination thereof.

Figure 4:
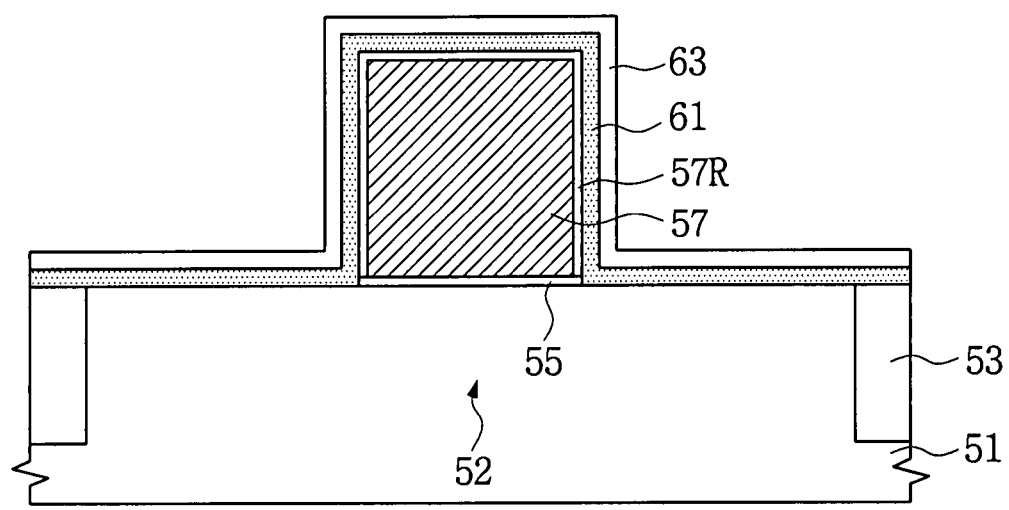

A gate electrode 57 formed of a polysilicon layer will be described below. Referring to FIG. 4, a re-oxidation layer 57R may be formed on the semiconductor substrate 51 having the gate electrode 57. The re-oxidation layer 57R may be a silicon oxide layer. The re-oxidation layer 57R may be formed by a thermal oxidation method. For example, the re-oxidation layer 57R may be a thermal oxide layer. The re-oxidation layer 57R may be formed to cover an upper surface and the sidewalls of the gate electrode 57. An oxide layer (not shown) may also be formed on the active region 52 exposed on both sides of the gate electrode 57 during the formation of the re-oxidation layer 57R. However, the growth rate of the re-oxidation layer 57R may be about three times higher than the growth rate of the oxide layer. Therefore, the oxide layer of the exposed active region 52 may not be discussed further.

An etch stop layer 61 and a first spacer layer 63 may be sequentially stacked on the semiconductor substrate 51 having the re-oxidation layer 57R. The etch stop layer 61 may be formed of a material layer having an etch selectivity with respect to the first spacer layer 63. Also, the etch stop layer 61 may be formed of a material layer having an etch selectivity with respect to the first spacer layer 63, the semiconductor substrate 51, and the re-oxidation layer 57R. The etch stop layer 61 may be formed of a nitride layer, e.g., a silicon nitride layer or a silicon oxynitride layer. The etch stop layer 61 may be formed by a CVD method.

The etch stop layer 61 may be formed to a thickness of about 0.1 nm to about 100 nm. Thus, the etch stop layer 61 may be a relatively thin layer formed within a technically-controllable range. For example, the etch stop layer 61 may be formed to a thickness of about 3 nm to about 5 nm. The etch stop layer 61 may be stacked along the exposed surface of the semiconductor substrate 51. For example, the etch stop layer 61 may be formed to cover the upper surface and the sidewalls of the gate electrode 57 as well as the surface of the active region 52 on both sides of the gate electrode 57. The re-oxidation layer 57R may remain between the gate electrode 57 and the etch stop layer 61. Also, the etch stop layer 61 may cover the surface of the active region 52 on both sides of the gate electrode 57 at a relatively uniform thickness.

The first spacer layer 63 may be formed on the etch stop layer 61. The first spacer layer 63 may be formed of a material layer having an etch selectivity with respect to the etch stop layer 61. When the etch stop layer 61 is formed of a nitride layer, the first spacer layer 63 may be formed of a silicon oxide layer. The first spacer layer 63 may be stacked along the exposed surface of the semiconductor substrate 51. For example, the first spacer layer 63 may be formed to cover the upper surface and the sidewalls of the gate electrode 57 as well as the surface of the active region 52 disposed on both sides of the gate electrode 57. As a result, the re-oxidation layer 57R, the etch stop layer 61, and the first spacer layer 63 may be sequentially stacked on the sidewalls of the gate electrode 57. Also, the etch stop layer 61 and the first spacer layer 63 may be sequentially stacked on the active region 52 disposed on both sides of the gate electrode 57.

Figure 5:
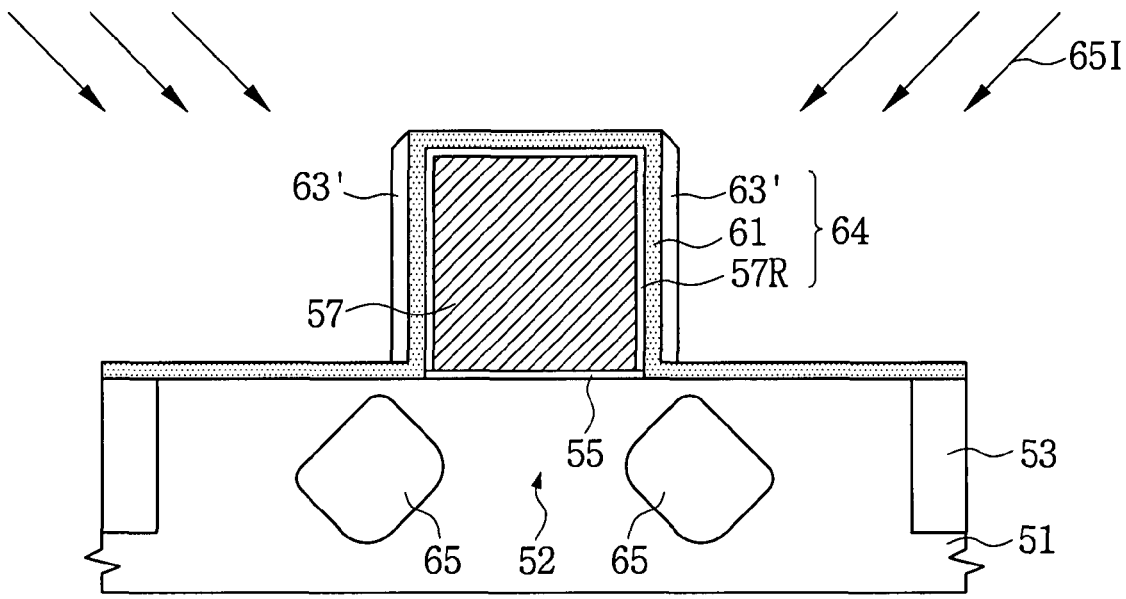

Referring to FIG. 5, first spacers 63' may be formed by etching the first spacer layer 63. Etching the first spacer layer 63 may be performed by an anisotropical etching process until the etch stop layer 61 on the active region 52 is exposed. The etch stop layer 61 may reduce or prevent the etching of the active region 52. A by-product (e.g., polymer) may be generated on the semiconductor substrate 51 during the formation of the first spacer layer 63. Consequently, the by-product may be removed using a cleaning process. The etch stop layer 61 may protect the active region 52 during the cleaning process.

As a result, the first spacers 63' may remain on the sidewalls of the gate electrode 57. The re-oxidation layer 57R, the etch stop layer 61, and the first spacers 63', which may be sequentially stacked on the sidewalls of the gate electrode 57, may constitute the offset spacers 64. The etch stop layer 61 having a relatively uniform thickness may remain on the active region 52 disposed on both sides of the gate electrode 57.

Halo regions 65 may be formed in the active region 52 below the edges of the gate electrode 57 using a halo ion implantation process 65I. The halo regions 65 may be formed to have the same first conductivity type impurity ions as the semiconductor substrate 51. For example, when the semiconductor substrate 51 has p-type impurity ions, the halo regions 65 may be formed by implanting p-type impurity ions. The halo ion implantation process 65I may be performed using various angles and energies. For example, the halo regions 65 may be formed by an inclined ion implantation process. In such a case, the halo regions 65 may be overlapped by the lower portion of the offset spacers 64. Alternatively, the halo regions 65 may be formed before the first spacers 63' are formed. Furthermore, the halo regions 65 may be formed before the etch stop layer 61 is formed.

Figure 6:
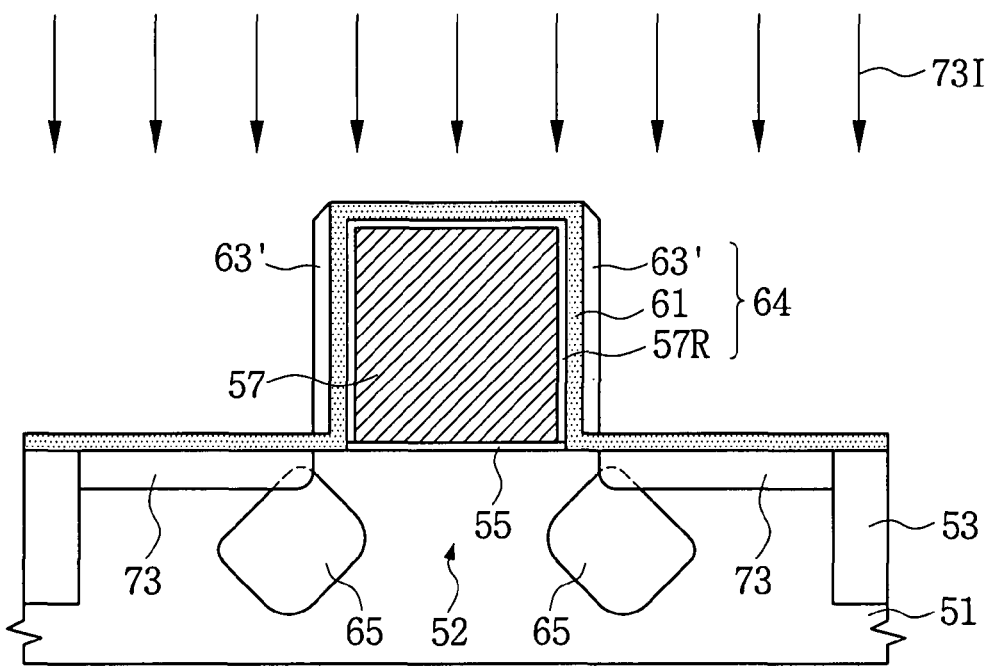

Referring to FIG. 6, a pair of LDD regions 73, which may be spaced apart from each other, may be formed in the active region 52 adjacent to both sides of the gate electrode 57 using an LDD ion implantation process 73I. The LDD ion implantation process 73I may be performed using the gate electrode 57 and the offset spacers 64 as an ion implantation mask. Consequently, the LDD regions 73 may be arranged outside the coverage of the offset spacers 64. Thus, the LDD regions 73 may be spaced apart from the gate electrode 57 by a distance approximately equal to the thickness of the offset spacer 64.

The LDD regions 73 may have second conductivity type impurity ions, Which may be different from the impurity ions in the semiconductor substrate 51. The second conductivity type impurity ions may be n- or p-type. For example, when the semiconductor substrate 51 has p-type impurity ions, the LDD regions 73 may be formed by implanting n-type impurity ions. As described above with reference to FIG. 5, the etch stop layer 61 having a relatively thin and relatively uniform thickness may remain on the active region 52 on both sides of the gate electrode 57. Accordingly, the LDD regions 73 may have a relatively uniform impurity concentration.

Figure 7:
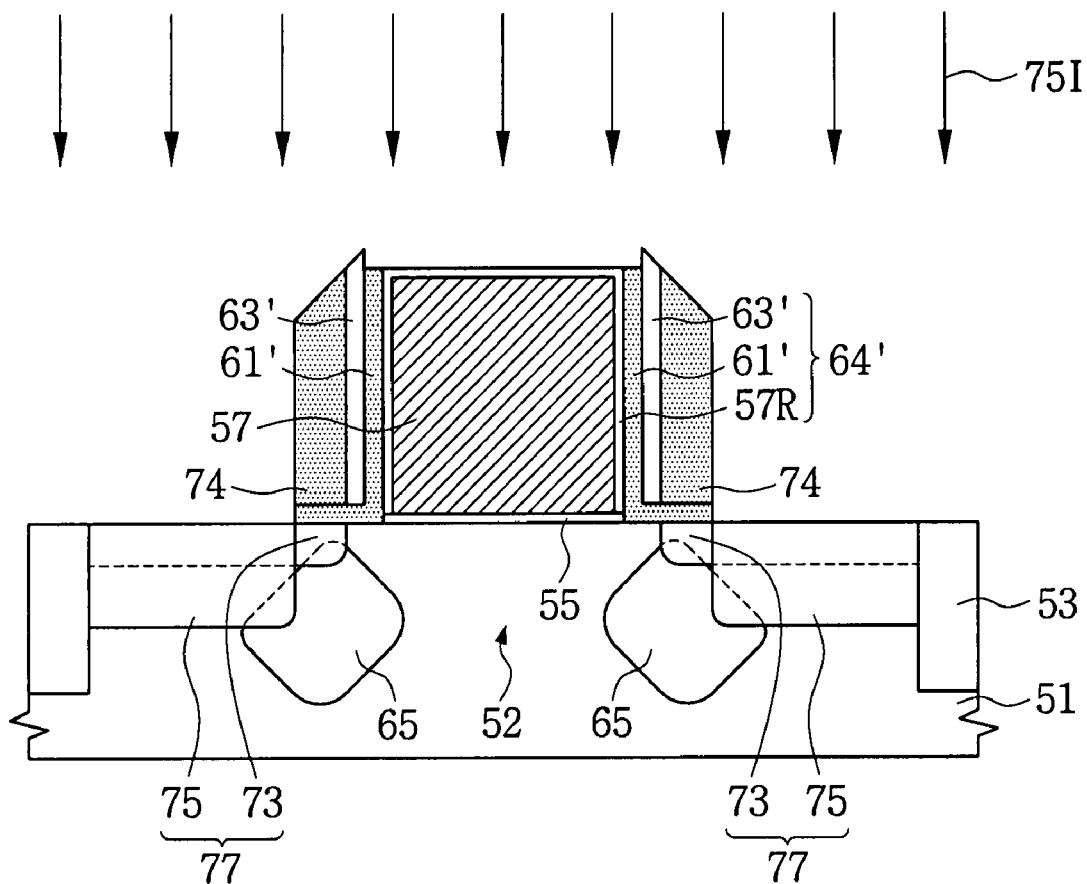

Referring to FIG. 7, second spacers 74 may be formed on the first spacers 63' on both sides of the gate electrode 57. The second spacers 74 may be formed of a material layer having an etch selectivity with respect to the first spacers 63'. The second spacers 74 may be formed of a nitride layer, e.g., a silicon nitride layer or a silicon oxynitride layer.

Etch stop patterns 61' may be formed by partially removing the etch stop layer 61 during the formation of the second spacers 74. The etch stop patterns 61' may remain between the first spacers 63' and the re-oxidation layer 57R. The etch stop patterns 61' may also remain between the first spacers 63' and the active region 52. Additionally, the etch stop patterns 61' may remain between the second spacers 74 and the active region 52. Consequently, the active region 52 outside the coverage of the second spacers 74 may be exposed. The re-oxidation layer 57R disposed on the upper surface of the gate electrode 57 may also be exposed. The first spacers 63', the etch stop patterns 61', and the re-oxidation layer 57R may constitute offset spacer patterns 64'.

Higher-concentration impurity regions 75 may be formed in the active region 52 outside the coverage of the second spacers 74 using a drain ion implantation process 75I. The drain ion implantation process 75I may be performed using the gate electrode 57, the offset spacer patterns 64', and the second spacers 74 as an ion implantation mask. Consequently, the higher-concentration impurity regions 75 may be arranged outside the coverage of the second spacers 74. In contrast, a portion of the LDD regions 73 may be below the second spacers 74.

The higher-concentration impurity regions 75 may be formed to have second conductivity-type impurity ions, which may be different from the impurity ions in the semiconductor substrate 51. The second conductivity-type impurity ions may be n- or p-type. For example, when the semiconductor substrate 51 has p-type impurity ions, the higher-concentration impurity regions 75 may be formed by implanting n-type impurity ions. The LDD regions 73 and the higher-concentration impurity regions 75 may constitute source and drain regions 77. Thus, a pair of source and drain regions 77, which may be spaced apart from each other, may be formed in the active region 52 adjacent to both sides of the gate electrode 57.

As described above, the etch stop layer 61 may be formed on the entire surface of the semiconductor substrate 51 having the gate electrode 57. The etch stop layer 61 may be formed of a material layer having an etch selectivity with respect to the first spacer layer 63. The first spacers 63' may be formed on the sidewalls of the gate electrode 57 by anisotropically etching the first spacer layer 63. Consequently, the etch stop layer 61 having a relatively uniform thickness may be exposed on the semiconductor substrate 51 on both sides of the gate electrode 57. The etch stop layer 61 may protect the semiconductor substrate 51 during the etching and cleaning processes for forming the first spacers 63'.

The etch stop layer 61 and the first spacers 63', which may be sequentially stacked on the sidewalls of the gate electrode 57, may constitute the offset spacers 64. The LDD regions 73 may be formed in the active region 52 using the gate electrode 57 and the offset spacer 64 as an ion implantation mask. Accordingly, the LDD regions 73 may have a relatively uniform impurity concentration.

A semiconductor device having an offset spacer according to example embodiments will be described below with reference to FIG. 7. Referring again to FIG. 7, an isolation layer 53 defining an active region 52 may be formed in the semiconductor substrate 51. The semiconductor substrate 51 may be a silicon wafer having first conductivity type impurity ions. The first conductivity type impurity ions may be n- or p-type. For example, the semiconductor substrate 51 may be a silicon wafer having p-type impurity ions. The isolation layer 53 may be formed of an insulating layer, e.g., a silicon oxide layer, a silicon nitride layer, a silicon oxynitride layer, or a combination thereof. For example, the isolation layer 53 may be formed of a higher-density plasma oxide layer.

A gate electrode 57, which may extend across the active region 52, may be provided on the semiconductor substrate 51. A gate dielectric layer 55 may be interposed between the gate electrode 57 and the semiconductor substrate 51. The gate dielectric layer 55 may be formed of an insulating layer, e.g., a silicon oxide layer, a silicon nitride layer, a silicon oxynitride layer, a higher-K dielectric layer, or a combination thereof. The gate electrode 57 may be formed of a conductive layer, e.g., a polysilicon layer, a metal layer, a metal silicide layer, or a combination thereof.

The gate electrode 57 may be covered with a re-oxidation layer 57R. For example, the re-oxidation layer 57R may be formed to cover an upper surface and the sidewalls of the gate electrode 57. The re-oxidation layer 57R may be a thermal oxide layer. For example, the re-oxidation layer 57R may be a silicon oxide layer.

First spacers 63' may be disposed on the sidewalls of the gate electrode 57. Second spacers 74 may be provided on the first spacers 63'. Thus, the first spacers 63' and the second spacers 74 may be sequentially stacked on the sidewalls of the gate electrode 57. Etch stop patterns 61' may be interposed between the first spacers 63' and the gate electrode 57. For example, the etch stop patterns 61' may be provided on the re-oxidation layer 57R on the sidewalls of the gate electrode 57. The re-oxidation layer 57R, the etch stop patterns 61', and the first spacers 63', which may be sequentially stacked on the sidewalls of the gate electrode 57, may constitute offset spacer patterns 64'.

The etch stop patterns 61' may be disposed between the semiconductor substrate 51 and the first spacers 63'. The etch stop patterns 61' may also be disposed between the semiconductor substrate 51 and the second spacers 74. The etch stop patterns 61' may be formed of a material layer having an etch selectivity with respect to the first spacers 63'. The etch stop patterns 61' may also be formed of a material layer having an etch selectivity with respect to the first spacers 63', the semiconductor substrate 51, and the re-oxidation layer 57R. The etch stop patterns 61' may be formed of a nitride layer, e.g., a silicon nitride layer or a silicon oxynitride layer. The etch stop patterns 61' may be formed to a thickness of about 0.1 nm to about 100 nm. The etch stop patterns 61' may be formed within a technically controllable range so as to be relatively thin. For example, the etch stop patterns 61' may be formed to a thickness of about 3 nm to about 5 nm.

The first spacers 63' may be formed of a material layer having an etch selectivity with respect to the etch stop patterns 61'. When the etch stop patterns 61' are formed of a nitride layer, the first spacers 63' may be formed of a silicon oxide layer. The second spacers 74 may be formed of a material layer having an etch selectivity with respect to the first spacers 63'. The second spacers 74 may be formed of a nitride layer, e.g., a silicon nitride layer or a silicon oxynitride layer.

LDD regions 73 may be disposed in the active region 52 below the second spacers 74 but outside the coverage of the first spacers 63'. The LDD regions 73 may be spaced apart from the gate electrode 57 by a distance about equal to the thickness of the offset spacer patterns 64'. The LDD regions 73 may include second conductivity type impurity ions, which may be different from the impurity ions in the semiconductor substrate 51. The second conductivity type impurity ions may be n- or p-type. For example, when the semiconductor substrate 51 has p-type impurity ions, the LDD regions 73 may include n-type impurity ions.

Higher-concentration impurity regions 75 may be provided in the active region 52 outside the coverage of the second spacers 74. The higher-concentration impurity regions 75 may include second conductivity type impurity ions, which may be different from the impurity ions in the semiconductor substrate 51. The second conductivity type impurity ions may be n- or p-type. For example, when the semiconductor substrate 51 has p-type impurity ions, the higher-concentration impurity regions 75 may include n-type impurity ions. The LDD regions 73 and the higher-concentration impurity regions 75 may constitute source and drain regions 77. Consequently, a pair of source and drain regions 77 may be disposed in the active region 52 on both sides of the gate electrode 57. The pair of source and drain regions 77 may be spaced apart from each other.

Halo regions 65, which may contact with the source and drain regions 77 and may be spaced apart from each other, may be provided between the source and drain regions 77. The halo regions 65 may be overlapped by the lower portion of the offset spacer patterns 64'. The halo regions 65 may be in contact with the LDD regions 73 and the higher-concentration impurity regions 75. The halo regions 65 may include first conductivity type impurity ions, which may be the same as the impurity ions in the semiconductor substrate 51. For example, when the semiconductor substrate 51 has p-type impurity ions, the halo regions 65 may also include p-type impurity ions.

As described above, an etch stop layer 61 may be formed on the entire surface of a semiconductor substrate 51 having a gate electrode 57. First spacers 63' may be formed on the sidewalls of the gate electrode 57. The etch stop layer 61 having a relatively uniform thickness may be exposed on the semiconductor substrate 51 on both sides of the gate electrode 57. While etching and cleaning processes for forming the first spacers 63' are performed, the etch stop layer 61 may act to protect the semiconductor substrate 51.

The etch stop layer 61 and the first spacers 63' sequentially stacked on the sidewalls of the gate electrode 57 may constitute an offset spacer 64. LDD regions 73 may be formed in the semiconductor substrate 51 using the gate electrode 57 and the offset spacers 64 as an ion implantation mask. As a result, the LDD regions 73 may have an impurity concentration of improved uniformity. Accordingly, a semiconductor device having improved electrical characteristics may be achieved.

While example embodiments have been disclosed herein, it should be understood that other variations may be possible. Such variations are not to be regarded as a departure from the spirit and scope of example embodiments of the present disclosure, and all such modifications as would be obvious to one skilled in the art are intended to be included within the scope of the following claims.

What is claimed is:

1. A method of forming a semiconductor device, comprising:
    forming a gate electrode on a semiconductor substrate;
    forming a re-oxidation layer on an upper surface and sidewall of the gate electrode using a thermal oxidation method;
    forming an etch stop layer on the semiconductor substrate and the gate electrode after forming the re-oxidation layer, the etch stop layer including a nitride;
    forming a first spacer on a sidewall of the gate electrode such that the etch stop layer is between the sidewall of the gate electrode and the first spacer;
    forming a lightly-doped drain region in the semiconductor substrate using the gate electrode and the first spacer as an ion implantation mask; and
    forming a second spacer on the first spacer.

2. The method of claim 1, wherein the etch stop layer is formed of a material having an etch selectivity with respect to the first spacer.

3. The method of claim 1, wherein the etch stop layer is formed of silicon nitride or silicon oxynitride.

4. The method of claim 1, wherein the etch stop layer is formed to a thickness of about 0.1 nm to about 100 nm.

5. The method of claim 1, wherein the gate electrode is formed of polysilicon.

6. The method of claim 1, wherein forming the first spacer includes:
    forming a first spacer layer on the etch stop layer; and
    anisotropically etching the first spacer layer until the etch stop layer on the semiconductor substrate is exposed, wherein the etch stop layer remains on the upper surface of the gate electrode.

7. The method of claim 1, wherein the first spacer is formed of silicon oxide.

8. The method of claim 1, further comprising:
    forming a halo region in the semiconductor substrate below the first spacer before forming the lightly-doped drain region.

9. The method of claim 1, further comprising:
    forming a higher-concentration impurity region in the semiconductor substrate using the gate electrode, the first spacer, and the second spacer as an ion implantation mask.

10. The method of claim 1, wherein the etch stop layer is formed so as to cover a top surface and sidewall of the re-oxidation layer.

* * * * *